US009355741B2

(12) United States Patent
Jeon et al.

(10) Patent No.: US 9,355,741 B2
(45) Date of Patent: May 31, 2016

(54) DISPLAY APPARATUS HAVING A GATE DRIVE CIRCUIT

(71) Applicant: Samsung Display Co., LTD., Yongin, Gyeonggi-Do (KR)

(72) Inventors: Sang-Jin Jeon, Suwon-si (KR); Jun-Ki Jeong, Anyang-si (KR); Se-Hyoung Cho, Hwaseong-si (KR)

(73) Assignee: Samsung Display Co., LTD. (KR)

( * ) Notice: Subject to any disclaimer, the term of this patent is extended or adjusted under 35 U.S.C. 154(b) by 0 days.

(21) Appl. No.: 14/276,801

(22) Filed: May 13, 2014

(65) Prior Publication Data

US 2015/0029082 A1    Jan. 29, 2015

(30) Foreign Application Priority Data

Jul. 24, 2013  (KR) .......................... 10-2013-0087091

(51) Int. Cl.
*G09G 3/36* (2006.01)
*G11C 19/28* (2006.01)

(52) U.S. Cl.
CPC ............... *G11C 19/28* (2013.01); *G09G 3/3677* (2013.01); *G09G 2310/0286* (2013.01)

(58) Field of Classification Search
CPC ............................... G11C 19/28; G09G 3/3685
USPC ........................................................... 345/98
See application file for complete search history.

(56) References Cited

U.S. PATENT DOCUMENTS

| 8,023,610 | B2 | 9/2011 | Miyayama et al. | |
|---|---|---|---|---|
| 8,422,621 | B2 | 4/2013 | Jang et al. | |
| 2004/0051688 | A1* | 3/2004 | Orii et al. | 345/87 |
| 2010/0134399 | A1 | 6/2010 | Ki et al. | |
| 2010/0156474 | A1 | 6/2010 | Park et al. | |
| 2011/0069044 | A1* | 3/2011 | Lee et al. | 345/204 |
| 2011/0128461 | A1 | 6/2011 | Koyama et al. | |
| 2012/0038616 | A1* | 2/2012 | Song et al. | 345/212 |
| 2012/0086697 | A1* | 4/2012 | Hasegawa | G09G 3/3688 345/212 |
| 2012/0163528 | A1 | 6/2012 | Jang et al. | |
| 2013/0010916 | A1 | 1/2013 | Jang et al. | |

FOREIGN PATENT DOCUMENTS

| KR | 10-2012-0011966 A | 2/2012 |
|---|---|---|
| KR | 10-2013-0028274 A | 3/2013 |

* cited by examiner

*Primary Examiner* — Jonathan Blancha
(74) *Attorney, Agent, or Firm* — Innovation Counsel LLP

(57) ABSTRACT

A gate drive circuit includes a shift register having a plurality of stages, in which an n-th stage ('n' is a natural number) of the plurality of stages is connected to at least one subsequent stage. The n-th stage includes a pull-up part configured to output a high voltage of an n-th gate signal using a high voltage of a clock signal as in response to a high voltage of a control node, a control pull-down part configured to pull-down a voltage of the control node into a low voltage in response to a carry signal outputted from at least one of next stages of the n-th stage and receiving a back-bias voltage corresponding to the low voltage, and a carry part configured to output the high voltage of the clock signal as an n-th carry signal in response to a high voltage of the control node.

20 Claims, 4 Drawing Sheets

DISPLAY APPARATUS HAVING A GATE DRIVE CIRCUIT

PRIORITY STATEMENT

This application claims priority under 35 U.S.C. §119 to Korean Patent Application No. 10-2013-0087091, filed on Jul. 24, 2013 in the Korean Intellectual Property Office KIPO, the contents of which are herein incorporated by reference in their entirety.

BACKGROUND OF THE INVENTION

1. Field of the Invention

Example embodiments of the present invention relate to a gate drive circuit and a display apparatus having the gate drive circuit. More particularly, example embodiments of the present invention relate to a gate drive circuit with improved reliability of a gate signal and a display apparatus having the gate drive circuit.

2. Description of the Related Art

Generally, a liquid crystal display ("LCD") device includes an LCD panel that displays an image using a light-transmitting ratio of liquid crystal molecules, and a backlight assembly disposed below the LCD panel to provide the LCD panel with light.

The LCD device includes a display panel in which a plurality of pixel parts connected to gate lines and data lines crossing the gate lines are formed, a gate drive circuit outputting a gate signal to the gate lines, and a data drive circuit outputting a data signal to the data lines. The gate drive circuit and the data drive circuit may be formed in a chip type, and may be formed on the display panel. A pixel includes a pixel electrode and a thin film transistor. The thin film transistor is connected to a data line, a gate line and the pixel electrode, and drives the pixel electrode. Generally, the thin film transistor includes an active layer having amorphous silicon.

In order to decrease a total size of a gate drive circuit and to reduce the size of an LCD and to simplify the manufacture of the LCD, a process in which the gate driving circuit is integrated on the LCD panel has been developed. The gate drive circuit includes a thin film transistor which is formed via a that is process substantially the same as that for forming the thin film transistor of the pixel. The thin film transistor of the gate drive circuit includes an active layer having the amorphous silicon.

SUMMARY OF THE INVENTION

A gate drive circuit capable of enhancing a reliability of the gate signal is provided.

A display device having the above-mentioned gate drive circuit is also provided.

According to one aspect, a gate drive circuit includes a shift register including a plurality of stages, wherein an n-th stage ('n' is a natural number) of the plurality of stages is connected to at least one subsequent stage of the plurality of stages. An n-th stage includes a pull-up part configured to output a high voltage of an n-th gate signal using a high voltage of a clock signal as in response to a high voltage of a control node, a control pull-down part configured to pull-down a voltage of the control node into a low voltage in response to a carry signal outputted from at least one of next stages of the n-th stage and receiving a back-bias voltage corresponding to the low voltage, and a carry part configured to output the high voltage of the clock signal as an n-th carry signal in response to a high voltage of the control node.

The control pull-down part may include a first control pull-down part configured to pull-down a voltage of the control node into a first low voltage in response to an (n+1)-th carry signal outputted from an (n+1)-th stage and receive the back-bias voltage.

The first control pull-down part may include a four-terminal transistor, and the four-terminal transistor may include a first control electrode receiving the (n+1)-th carry signal, a second control electrode receiving the back-bias voltage, an input electrode receiving the voltage of the control node, and an output electrode receiving the first low voltage.

The control pull-down part may include a second control pull-down part configured to pull-down a voltage of the control node into a second low voltage that is less than the first low voltage in response to an (n+2)-th carry signal outputted from an (n+2)-th stage, and receive the back-bias voltage.

The second control pull-down part may include a four-terminal transistor, and the four-terminal transistor may include a first control electrode receiving the (n+2)-th carry signal, a second control electrode receiving the back-bias voltage, an input electrode receiving the voltage of the control node, and an output electrode receiving the second low voltage.

The gate drive circuit may further include an output pull-down part configured to pull-down the n-th gate signal into the low voltage in response to a carry signal outputted from at least one of subsequent stages of the n-th stage.

The gate drive circuit may further include an invertor configured to output a signal synchronized with the clock signal during a remaining period of a frame period except for a period during which the n-th carry signal has a high voltage.

The gate drive circuit may further include a control holding part configured to maintain a voltage of the control node to a second low voltage in response to a signal outputted from the invertor.

The control holding part may include a four-terminal transistor, and the four-terminal transistor may include a first control electrode receiving the an output signal of the invertor, a second control electrode receiving the back-bias voltage, an input electrode receiving the voltage of the control node, and an output electrode receiving the second low voltage.

The gate drive circuit may further include a carry holding part configured to maintain the n-th carry signal to a second low voltage in response to a signal outputted from the invertor.

The gate drive circuit may further include an output holding part configured to maintain the n-th gate signal to a first low voltage in response to a signal outputted from the invertor.

According to another aspect, a display apparatus includes a display panel, a data drive circuit and a gate drive circuit. The display panel includes a display area on which a plurality of gate lines, a plurality of data lines and a plurality of pixel transistors are formed and a peripheral area surrounding the display area. The data drive circuit outputs data signals to the data lines. The gate drive circuit includes a shift register in which a plurality of stages are connected one after another to each other, each of the stages including a plurality of transistor, an n-th stage ('n' is a natural number) including a pull-up part configured to output a high voltage of an n-th gate signal using a high voltage of a clock signal in response to a high voltage of a control node, a control pull-down part configured to pull-down a voltage of the control node into a low voltage in response to a carry signal outputted from at least one of a set of subsequent stages of the n-th stage and receiving a back-bias voltage corresponding to the low voltage, and a carry part configured to output the high voltage of the clock signal as an n-th carry signal in response to a high voltage of the control node.

A pixel transistor of the display area and a transistor of the gate drive circuit may include an oxide semiconductive layer.

The control pull-down part may include a first control pull-down part configured to pull-down a voltage of the control node into a first low voltage in response to an (n+1)-th carry signal outputted from an (n+1)-th stage, and receive the back-bias voltage, and the first control pull-down part may include a four-terminal transistor which includes a first control electrode receiving the (n+1)-th carry signal, a second control electrode receiving the back-bias voltage, an input electrode receiving the voltage of the control node, and an output electrode receiving the first low voltage.

The control pull-down part may include a second control pull-down part configured to pull-down a voltage of the control node into a second low voltage that is less than the first low voltage in response to an (n+1)-th carry signal outputted from an (n+2)-th stage, and receive the back-bias voltage, and the second control pull-down part may include a four-terminal transistor which includes a first control electrode receiving the (n+2)-th carry signal, a second control electrode receiving the back-bias voltage, an input electrode receiving the voltage of the control node, and an output electrode receiving the second low voltage.

The n-th stage may further include an invertor configured to output a signal synchronized with the clock signal during a remaining period of a frame period except for a period during which the n-th carry signal has a high voltage.

The n-th stage may further include a control holding part configured to maintain the voltage of the control node to a second low voltage in response to a signal outputted from the invertor.

The control holding part may include a four-terminal transistor, and the four-terminal transistor may include a first control electrode receiving the an output signal of the invertor, a second control electrode receiving the back-bias voltage, an input electrode receiving the voltage of the control node, and an output electrode receiving the second low voltage.

The n-th stage may further include a carry holding part configured to maintain the n-th carry signal to a second low voltage in response to a signal outputted from the invertor.

The n-th stage may further include an output holding part configured to maintain the n-th gate signal to a first low voltage in response to a signal outputted from the invertor.

According to some example embodiments, a positive bias voltage is applied to the transistor which receives a negative bias voltage during a long period of time, so that a threshold voltage of the transistor may be prevented from being shifted toward the negative direction by the negative bias voltage. In addition, a transistor which maintains the voltage of the control node controlling an output of the gate signal of a self-stage (i.e., Gn of stage SRCn) to the low voltage in response to the carry signal of a next stage (i.e., SRCn+1), receives the back-bias voltage corresponding to the low voltage of the carry signal, so that the transistor may be stabilized, and thus the boost-up operation of the control node may be successful. Therefore, the self-stage outputs a normal gate so that reliability of the gate signal may be improved.

BRIEF DESCRIPTION OF THE DRAWINGS

The above and other features and advantages will become more apparent by describing in detailed example embodiments thereof with reference to the accompanying drawings, in which.

DETAILED DESCRIPTION OF THE INVENTION

Hereinafter, the present disclosure will be explained in detail with reference to the accompanying drawings.

Figure 1:
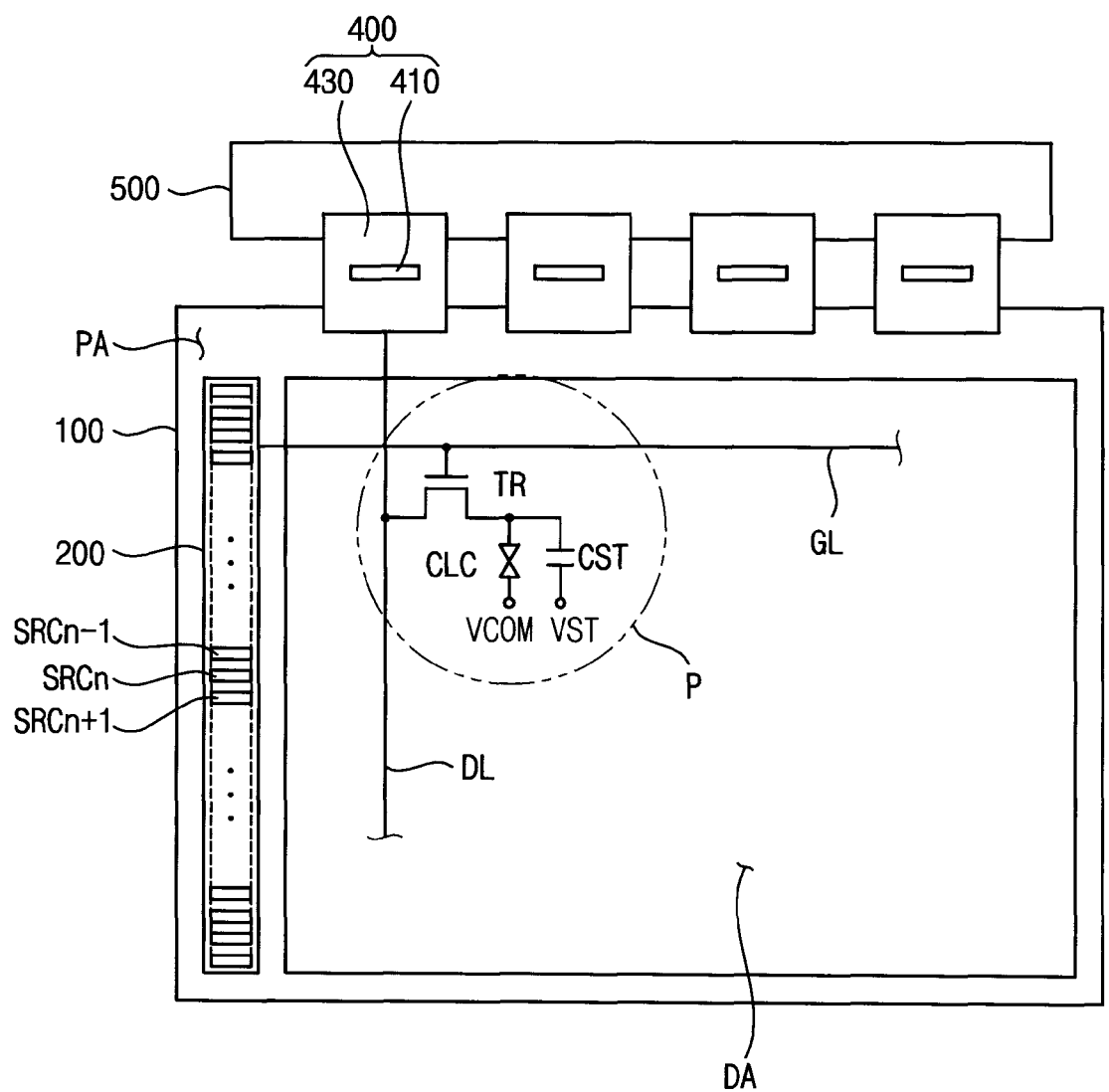
FIG. 1 is a plan view schematically showing a display apparatus according to an example embodiment.

FIG. 1 is a plan view schematically showing a display apparatus according to an example embodiment.

Referring to FIG. 1, the display apparatus may include a display panel 100, a gate drive circuit 200, a data drive circuit 400 and a printed circuit board 500.

The display panel 100 includes a display area DA and a peripheral area PA surrounding the display area DA. A plurality of gate lines, a plurality of data lines and a plurality of pixel parts P are disposed in the display area DA. Each of the pixel parts P include a pixel transistor TR which is electrically connected to a gate line GL and a data line DL, a liquid crystal capacitor CLC which is electrically connected to the pixel transistor TR, and a storage capacitor CST which is electrically connected to the liquid crystal capacitor CLC. The pixel transistor TR may include an active layer which has oxide semiconductive layer, including an oxide semiconductor. The oxide semiconductive layer may include, for example, the amorphous oxide having at least one of indium (In), zinc (Zn), gallium (Ga), tin (Sn) or hafnium (HF). For example, the oxide semiconductive layer may include an amorphous oxide having indium (In), zinc (Zn) and gallium (Ga) or an amorphous oxide having indium (In), zinc (Zn) and hafnium (HF). The oxide semiconductive layer may include the oxide such as indium zinc oxide (InZnO), indium gallium oxide (InGaO), indium tin oxide (InSnO), tin zinc oxide (ZnSnO), tin gallium oxide (GaSnO) and tin gallium oxide (GaZnO).

The gate drive circuit 200 includes a shift register that sequentially outputs gate signals of a high level to the plurality m of gate lines GLs. The shift register includes a plurality of stages (e.g., SRCn−1, SRCn and SRCn+1, wherein 'n' is a natural number). The gate drive circuit 200 is integrated in the peripheral area PA adjacent to a first terminal end of the gate lines GL. The gate drive circuit 200 includes a plurality of circuit transistor, and a circuit transistor which is formed via a process that is substantially same as that for forming the transistor TR of the pixel part P. The circuit transistor includes an active layer which has oxide semiconductive layer. In alternative embodiments, the gate drive circuit 200 may be integrated on two end portions of the gate lines GLs such as a dual structure.

The data drive circuit 400 includes a data drive chip 410 and a flexible circuit substrate 430. The data drive chip 410 is mounted on the flexible circuit substrate 430. The flexible circuit substrate 430 electrically connects the printed circuit board 500 and the display panel 100.

Figure 2:
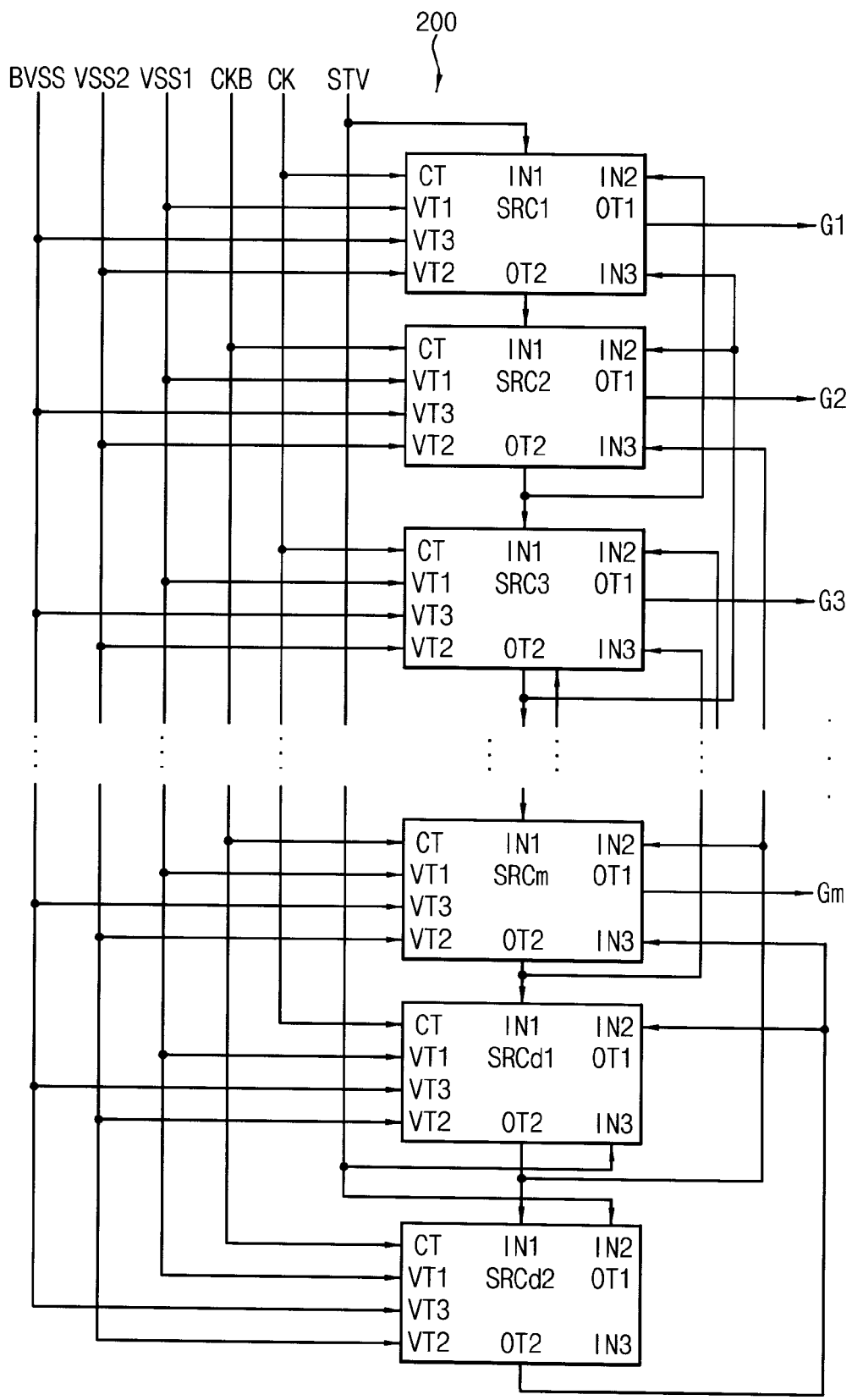
FIG. 2 is a block diagram illustrating a gate drive circuit of FIG. 1.

FIG. 2 is a block diagram illustrating a gate drive circuit of FIG. 1.

Referring to FIG. 2, the gate drive circuit 200 includes a shift register including first to m-th (non-dummy) stages SCR1 to SRCm that are cascade-connected to each other, a first dummy stage SRCd1 and a second dummy stage SRCd2. In this embodiment, 'm' is a natural number.

The first to m-th stages SRC1 to SRCm are respectively connected to m gate lines to sequentially provide the gate lines with first to m-th gate signals G1, G2, . . . , Gm. A first dummy stage SRCd1 helps to control driving of the (m−1)-th stage SRCm−1 and the m-th stage SRCm. A second dummy stage SRCd2 helps to control driving of the m-th stage SRCm and the first dummy stage STCd1. The first and second dummy stages SRCd1 and SRCd2 are not connected to gate lines.

Each of the stages includes a clock terminal CT, a first input terminal IN1, a second input terminal IN2, a third input terminal IN3, a first voltage terminal VT1, a second voltage terminal VT2, a first output terminal OT1 and a second output terminal OT2 (connected to a gate line GL).

The clock terminal CT receives a first clock signal or a second clock signal different from the first clock signal. For example, the second clock signal may have a phase opposite to the first clock signal. Hereinafter, the first clock signal may be referred to as a clock signal CK and the second clock signal may be referred to as an inversion clock signal CKB.

For example, the clock terminals CT of odd-numbered stages SRC1, SRC3, ..., SRCd1 receive the clock signal CK, and the clock terminals CT of even-numbered stages SRC2, SRC4, ..., SRCd2 receive the inversion clock signal CKB. The clock signal CK alternates periodically between a high voltage VDD and a first low voltage VSS1. The inversion clock signal CKB alternates periodically between a high voltage VDD and a first low voltage VSS1 and has a phase opposite to the clock signal CK.

The first input terminal IN1 receives a vertical start signal STV or a carry signal outputted from at least one of previous stages of the n-th stage. The first input terminal IN1 of the first stage SRC1 receives a vertical start signal STV. The first input terminals IN1 of stages from the second stage to the second dummy stage SRC2 to SRCd2 receive a carry signal outputted from at least one of the previous stages. For example, the first input terminal Ni of the n-th stage receives an (n−1)-th carry signal CRn−1 of an (n−1)-th stage.

The second input terminal IN2 receives a carry signal outputted from at least one of next stages or the vertical start signal STV. The second input terminals IN2 of the stages from the first stage to the first dummy stage SRC1 to SRCd1 receive the carry signal outputted from at least one of next stages. For example, the second input terminal IN2 of the n-th stage receives an (n+1)-th carry signal CRn+1 of an (n+1)-th stage. The second input terminal IN2 of the second dummy stage SRCd2, which is the last stage, receives the vertical start signal STV. The second input terminal IN2 of the second dummy stage SRCd2 may receive the vertical start signal STV of a next frame period.

The third input terminal IN3 receives a carry signal outputted from at least one of the next stages or the vertical start signal STV. The third input terminals IN3 of stages from the first stage to m-th stage SRC1 to SRCm receive the carry signal outputted from at least one of the next stages. The third input terminal IN3 of the first dummy stage SRCd1 receives the vertical start signal STV. For example, the third input terminal IN3 of the n-th stage receives an (n+2)-th carry signal CRn+2 of an (n+2)-th stage.

The first voltage terminal VT1 receives the first low voltage VSS1. The first low voltage VSS1 has a first low level, and the first low level may correspond to a low level of the gate signal. For example, the first low level is about −6 V.

The second voltage terminal VT2 receives a second low voltage VSS2 which has a second low level that is less than the first low level VSS1. The second low level may correspond to a low level of the control node Q in the stage. For example, the second low level is about −10 V.

The third voltage terminal VT3 receives a back-bias voltage BVSS. The back-bias voltage BVSS may correspond to a back-bias voltage level of the second low voltage VSS2. When the second low voltage VSS2 is about −10 V, the back-bias voltage BVSS may be about 10 V.

The first output terminal OT1 outputs the gate signal and is connected to the gate line. The first output terminals OT1 of the stages from the first stage to the m-th stage SRC1 to SRCm respectively output first to m-th gate signals G1, G2, ..., Gm. The first output terminal OT1 of the first and second dummy stages SRCd1 and SRCd2 do not output the gate signal.

The second output terminal OT2 outputs the carry signal. The second output terminal OT2 is connected to the first input terminal IN1 of at least one of the subsequent stages and to the second and third input terminals IN2 and IN3 of at least two of the previous stages.

Figure 3:
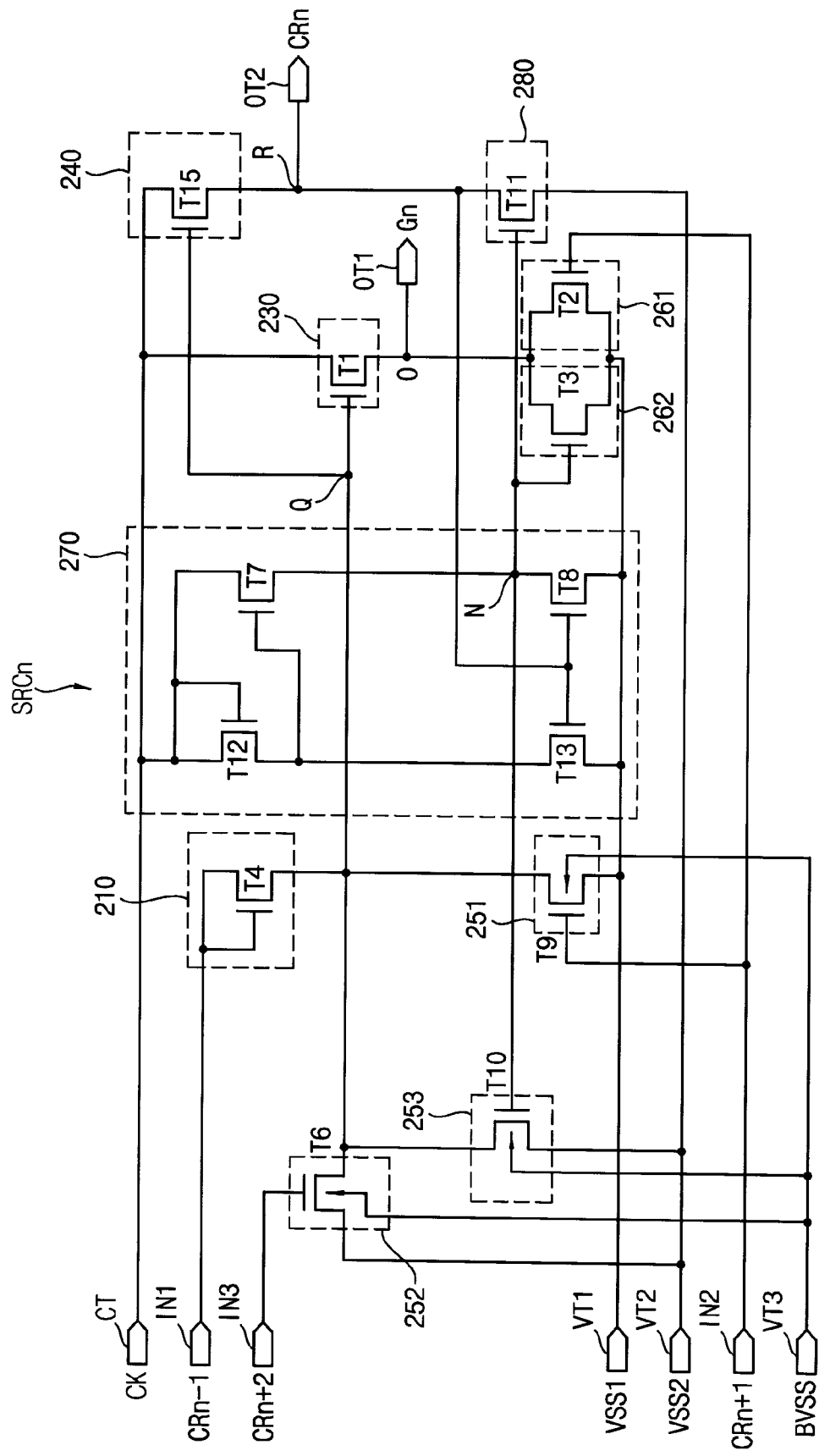
FIG. 3 is a circuit diagram illustrating a stage of FIG. 2.
Figure 4:
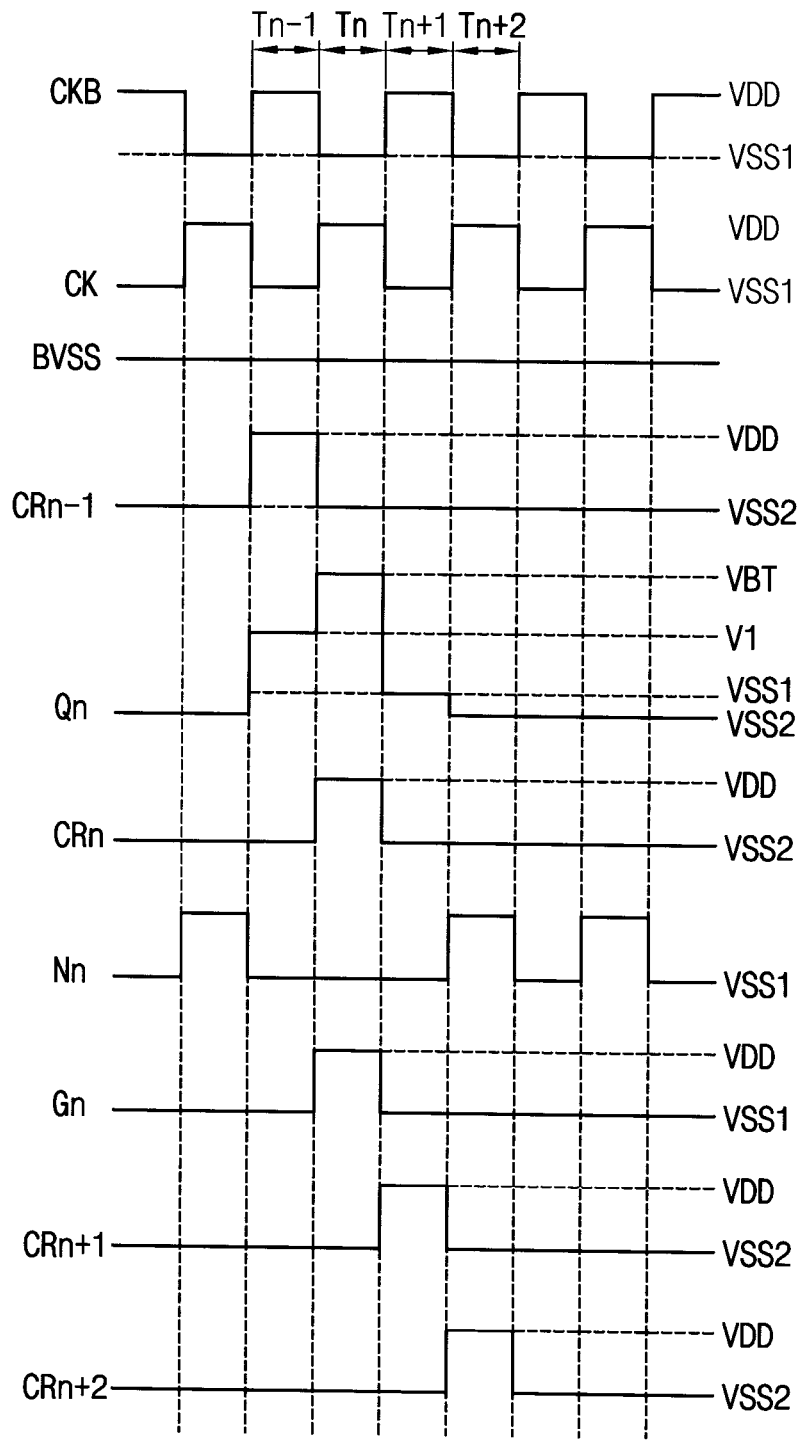
FIG. 4 is waveform diagrams showing signals of a stage of FIG. 3.

FIG. 3 is a circuit diagram illustrating a stage of FIG. 2. FIG. 4 is waveform diagrams showing signals of a stage of FIG. 3.

Referring to FIGS. 3 and 4, n-th stage SRCn includes a buffer part 210, a pull-up part 230, a carry part 240, a first control pull-down part 251, a second control pull-down part 252, a control holding part 253, an output pull-down part 261, an output holding part 262, an invertor 270 and a carry holding part 280.

The buffer part 210 transfers an (n−1)-th carry signal CRn−1 to the pull-up part 230. The buffer part 210 may include a fourth transistor T4. The fourth transistor T4 includes a control electrode and an input electrode which are both connected to the first input terminal In1, and an output electrode which is connected to a control node Q.

When the buffer part 210 receives a high voltage VDD of the (n−1)-th carry signal CRn−1, the control node Q receives a first voltage V1 corresponding to the high voltage VDD.

The pull-up part 230 outputs an n-th gate signal Gn. The pull-up part 230 may include a first transistor T1. The first transistor T1 includes a control electrode which is connected to the control node Q, an input electrode which is connected to the clock terminal CT, and an output electrode which is connected to an output node O. The output node O is connected to the first output terminal OT1.

In a state in which the first voltage V1 of the control node Q is applied to a control electrode of the pull-up part 230, when the clock terminal CT receives a high voltage VDD of the clock signal CK, the control node Q is boosted up to a boosted voltage VBT that is greater than the first voltage V1. Thus, the control node Q has the first voltage V1 during an (n−1)-th period Tn−1, and has the boosted voltage VBT during an n-th period Tn.

During the n-th period Tn in which the boosted voltage VBT is applied to the control electrode of the pull-up part 230, the pull-up part 230 outputs a high voltage VDD of an n-th gate signal Gn using a high voltage VDD of the clock signal CK. The n-th gate signal Gn is outputted through the first output terminal OT1 connected to the output node O.

The carry part 240 outputs an n-th carry signal CRn. The carry part 240 may include a fifth transistor T15. The fifth transistor T15 includes a control electrode which is connected to the control node Q, an input electrode which is connected to the clock terminal CT, and an output electrode which is connected to a carry node R. The carry node R is connected to a second output terminal OT2.

When a high voltage is applied to the control node Q, the carry part 240 outputs a high voltage VDD of the clock signal CK (received from the clock terminal CT) as an n-th carry signal CRn. The n-th carry signal CRn is outputted through the second output terminal OT2 connected to the carry node R of the n-th stage SRCn.

The first and second control pull-down parts 251 and 252 sequentially pull-down a voltage of the control node Q into the first and second low voltages VSS1 and VSS2 in response to the (n+1)-th carry signal CRn+1 and the (n+2)-th carry signal CRn+2.

The first control pull-down part 251 may include a ninth transistor T9 which is a four-terminal transistor. The ninth transistor T9 includes a first control electrode which is connected to the second input terminal IN2, a second control electrode which is connected to the third voltage terminal VT3, an input electrode which is connected to the control node Q, and an output electrode which is connected to the first voltage terminal VT1.

The first control electrode may be formed from the same metal layer as the gate line in the display area, and the second control electrode may be formed from the same conductive layer as the pixel electrode in the display area.

When the second input terminal IN2 receives a high voltage VDD of the (n+1)-th carry signal CRn+1 during an (n+1)-th period Tn+1, the ninth transistor T9 pulls-down a voltage of the control node Q into the first low voltage VSS1 (received from the first voltage terminal VT1). The first control electrode of the ninth transistor T9 receives the second low voltage VSS2 (−10V), that is, low voltage of the (n+1)-th carry signal CRn+1 is applied during a remaining period of a frame period except for the (n+1)-th period Tn+1.

In an oxide transistor which includes an active layer having the oxide semiconductive layer, when a negative gate voltage is applied to the oxide transistor for a long period of time, e.g., hours, a threshold voltage of the oxide transistor is shifted toward a negative direction corresponding to the negative gate voltage. Thus, the ninth transistor T9 receives the second low voltage VSS2 (−10V) such long time periods, so that a threshold voltage of the ninth transistor T9 may be shifted toward the negative direction. When the threshold voltage of the ninth transistor T9 is shifted toward the negative direction, the voltage of the control node Q connected to the ninth transistor T9 may be dropped. Thus, the boost-up operation of the control node Q may be unsuccessful. Therefore, the n-th stage SRCn outputs the n-th gate signal that is an abnormal output signal.

According to the example embodiments, a back-bias voltage BVSS corresponding to the second low voltage VSS2 (−10V) may be always applied to the second control electrode of the ninth transistor T9. The back-bias voltage BVSS is applied with a direct current. Thus, the back-bias voltage BVSS may prevent the threshold voltage of the ninth transistor T9 from being shifted toward the negative direction.

The second control pull-down part 252 may include a sixth transistor T6 which is a four-terminal transistor. The sixth transistor T6 includes a first control electrode which is connected to the third input terminal IN3, a second control electrode which is connected to the third voltage terminal VT3, an input electrode which is connected to the control node Q, and an output electrode which is connected to the second voltage terminal VT2.

The first control electrode may be formed from the same metal layer as the gate line in the display area, and the second control electrode may be formed from the same conductive layer as the pixel electrode in the display area.

When the third input terminal IN3 receives a high voltage VDD of the (n+2)-th carry signal CRn+2 during an (n+2)-th period Tn+2, the sixth transistor T6 pulls-down a voltage of the control node Q into the second low voltage VSS2 (received from the second voltage terminal VT2). The first control electrode of the sixth transistor T6 receives the second low voltage VSS2 (−10V), that is, the low voltage of the (n+2)-th carry signal CRn+2 is applied during a remaining period of a frame period except for the (n+2)-th period Tn+2.

According to the example embodiments, a back-bias voltage BVSS corresponding to the second low voltage VSS2 (−10V) may be always applied to the second control electrode of the sixth transistor T6. The back-bias voltage BVSS is applied with a direct current. Thus, the back-bias voltage BVSS may prevent the threshold voltage of the sixth transistor T6 from being shifted toward the negative direction.

Therefore, the back-bias voltage BVSS is applied to the sixth and ninth transistors T6 and T9, which control the control node Q, so that reliability of the gate signal Gn may be improved.

The control holding part 253 maintains the voltage of the control node Q to the second low voltage VSS2. The control holding part 253 may include a tenth transistor T10. The tenth transistor T10 includes a control electrode which is connected to the invertor node N, an input electrode which is connected to the control node Q, and an output electrode which is connected to the second voltage terminal VT2. The control holding part 253 maintains the voltage of the control node Q to the second low voltage VSS2 in response to a voltage of an invertor node N during a remaining period of the frame period.

Alternatively, according to an example embodiment, the tenth transistor T10 controls the control node Q, and thus, the tenth transistor T10 may be a four-terminal transistor as the sixth and ninth transistors T6 and T9 described above.

For example, the tenth transistor T10 may include a first control electrode which is connected to the invertor node N, a second control electrode which is connected to the third voltage terminal VT3, an input electrode which is connected to the control node Q and an output electrode which is connected to the second voltage terminal VT2. The tenth transistor T10 always receives the back-bias voltage BVSS so that the threshold voltage of the tenth transistor T10 may be stabilized. Therefore, the control node Q may be stabilized so that the reliability of the gate signal Gn may be improved.

The output pull-down part 261 pulls-down the n-th gate signal Gn into the first low voltage VSS1. The output pull-down part 261 may include a second transistor T2. The second transistor T2 includes a control electrode which is connected to the second input terminal IN2, an input electrode which is connected to the output node O and an output electrode which is connected to the first voltage terminal VT1. When the second input terminal IN2 receives a high voltage VDD of the (n+1)-th carry signal CRn+1, the output pull-down part 261 pulls-down the voltage of the output node O into the first low voltage VSS1 (received from the first voltage terminal VT1).

The output holding part 262 maintains the voltage of the output node O to the first low voltage VSS1. The output holding part 262 may include a third transistor T3. The third transistor T3 includes a control electrode which is connected to the invertor node N, an input electrode which is connected to the output node O, and an output electrode which is connected to the first voltage terminal VT1. The output holding part 262 maintains the voltage of the output node O to the first low voltage VSS1 (received from the first voltage terminal VT1) in response to a signal of the invertor node N during a remaining period of the frame period.

The invertor 270 applies a signal which has a phase identical to that of the clock signal CK received at the clock terminal CT to the invertor node N, during a remaining period of the frame period except the n-th period Tn. The invertor 270 may include a twelfth transistor T12, a seventh transistor T7, a thirteenth transistor T13 and a eighth transistor T8.

The twelfth transistor T12 includes a control electrode and an input electrode which are both connected to the clock terminal CT, and an output electrode which is connected to an input electrode of the thirteenth transistor T13 and the seventh transistor T7. The seventh transistor T7 includes a control electrode which is connected to the thirteenth transistor TR13, an input electrode which is connected to the clock terminal CT, and an output electrode which is connected to an input electrode of the eighth transistor T8. An output electrode of the seventh transistor T7 is connected to the invertor node N.

The thirteenth transistor T13 includes a control electrode which is connected to the carry node R, an input electrode which is connected to the twelfth transistor T12, and an output electrode which is connected to the first voltage terminal VT1. The eighth transistor T8 includes a control electrode which is connected to the carry node R, an input electrode which is connected to the invertor node N, and an output electrode which is connected the first voltage terminal VT1.

During the n-th period Tn of the frame period in which a high voltage is applied to the carry node R, the invertor 270 discharges the clock signal CK received from the clock terminal CT into the first low voltage VSS1 received from the first voltage terminal VT1. The eighth and thirteenth transistors T8 and T13 are turned-on in response to a high voltage of the carry node R. Accordingly, the clock signal CK is discharged into the first low voltage VSS1 during the n-th period Tn.

The carry holding part 280 maintains a voltage of the carry node R to the second low voltage VSS2. The carry holding part 280 may include an eleventh transistor T11. The eleventh transistor T11 includes a control electrode which is connected to the invertor node N, an input electrode which is connected to the carry node R and an output electrode which is connected to the second voltage terminal VT2. The carry holding part 280 maintains the voltage of the carry node R to the second low voltage VSS2 (received from the second voltage terminal VT2) in response to the signal of the invertor node N during a remaining period of the frame period except for the n-th period Tn.

According to the above, according to the present example embodiments, the positive bias voltage is applied to the transistor which receives a negative bias voltage during a long time period, so that a threshold voltage of the transistor may be prevented from being shifted toward the negative direction by the negative bias voltage. In addition, a transistor which maintains the voltage of the control node controlling an output of the gate signal of the self-stage (i.e., Gn of SRCn) to the low voltage in response to the carry signal of the subsequent stage (i.e., SRCn+1), receives the back-bias voltage corresponding to the low voltage of the carry signal, so that the transistor may be stabilized, and thus the boost-up operation of the control node may be successful. Therefore, the self-stage outputs a normal gate so that the reliability of the gate signal may be improved.

The foregoing is illustrative of the present disclosure and is not to be construed as limiting thereof. Although a few example embodiments have been described, those skilled in the relevant art will readily appreciate that many modifications are possible in the example embodiments without materially departing from the novel teachings and advantages of the present invention. Accordingly, all such modifications are intended to be included within the scope of the present invention. In the claims, means-plus-function clauses are intended to cover the structures described herein as performing the recited function and not only structural equivalents but also equivalent structures. Therefore, it is to be understood that the foregoing is illustrative and is not to be construed as limited to the specific example embodiments disclosed, and that modifications to the disclosed example embodiments, as well as other example embodiments, are intended to be included within the scope of the disclosure, including the appended claims.

What is claimed is:

1. A gate drive circuit comprising:
a shift register including a plurality of stages, wherein an n-th stage ('n' being a natural number) of the plurality of stages is connected to at least one subsequent stage of the plurality of stages, the n-th stage comprising:
a pull-up part configured to output a high voltage of an n-th gate signal using a high voltage of a clock signal in response to a high voltage of a control node during an n-th period of a frame period;
a control pull-down part configured to pull-down a voltage of the control node into a low voltage in response to a high voltage of a carry signal outputted from the at least one subsequent stage of the n-th stage and receive a back-bias voltage with a direct current during a remaining period in which a low voltage of the carry signal is applied to the control pull-down part, wherein the low voltage is a negative voltage and the back-bias voltage is a positive voltage having a positive level opposite to a negative level of the low voltage; and
a carry part configured to output the high voltage of the clock signal as an n-th carry signal in response to the high voltage of the control node.

2. The gate drive circuit of claim 1, wherein the control pull-down part comprises a first control pull-down part configured to pull-down the voltage of the control node into a first low voltage in response to an (n+1)-th carry signal outputted from an (n+1)-th stage and receive the positive back-bias voltage.

3. The gate drive circuit of claim 2, wherein the first control pull-down part comprises a four-terminal transistor, and
the four-terminal transistor includes a first control electrode configured to receive the (n+1)-th carry signal, a second control electrode configured to receive the positive back-bias voltage, an input electrode configured to receive the voltage of the control node, and an output electrode configured to receive the first low voltage.

4. The gate drive circuit of claim 2, wherein the control pull-down part further comprises a second control pull-down part configured to pull-down the voltage of the control node into a second low voltage that is lower than the first low voltage in response to an (n+2)-th carry signal outputted from an (n+2)-th stage, and receive the positive back-bias voltage.

5. The gate drive circuit of claim 4, wherein the second control pull-down part comprises a four-terminal transistor, and
the four-terminal transistor includes a first control electrode configured to receive the (n+2)-th carry signal, a second control electrode configured to receive the positive back-bias voltage, an input electrode configured to receive the voltage of the control node, and an output electrode configured to receive the second low voltage.

6. The gate drive circuit of claim 1, further comprising:
an output pull-down part configured to pull-down a voltage of the n-th gate signal into a low voltage in response to the carry signal outputted from the at least one of subsequent stages of the n-th stage.

7. The gate drive circuit of claim 1, further comprising:
an invertor configured to output an output signal synchronized with the clock signal during the remaining period of the frame period except for a period during which the n-th carry signal has the high voltage.

8. The gate drive circuit of claim 7, further comprising:
a control holding part configured to maintain the voltage of the control node to a second low voltage in response to the output signal outputted from the invertor.

9. The gate drive circuit of claim 8, wherein the control holding part comprises a four-terminal transistor, and
the four-terminal transistor comprises a first control electrode configured to receive the output signal of the invertor, a second control electrode configured to receive the positive back-bias voltage, an input electrode configured to receive the voltage of the control node, and an output electrode configured to receive the second low voltage.

10. The gate drive circuit of claim 7, further comprising:
a carry holding part configured to maintain the n-th carry signal to the second low voltage in response to the output signal outputted from the invertor.

11. The gate drive circuit of claim 7, further comprising:
an output holding part configured to maintain the n-th gate signal to the first low voltage in response to the output signal outputted from the invertor.

12. A display apparatus comprising:
a display panel including a display area and a peripheral area surrounding the display area, wherein a plurality of gate lines, a plurality of data lines, and a plurality of pixel transistors are formed on the display area;
a data drive circuit configured to output data signals to the plurality of data lines; and
a gate drive circuit including a shift register in which a plurality of stages are connected one after another to each other, wherein an n-th stage ('n' being a natural number) of the plurality of stages comprises:
a pull-up part configured to output a high voltage of an n-th gate signal using a high voltage of a clock signal in response to a high voltage of a control node;
a control pull-down part configured to pull-down a voltage of the control node into a low voltage in response to a high voltage of a carry signal outputted from at least one of a set of subsequent stages of the n-th stage and receive a back-bias voltage with a direct current during a remaining period in which a low voltage of the carry signal is applied to the control pull-down part, wherein the low voltage is a negative voltage and the back-bias voltage is a positive voltage having a positive level opposite to a negative level of the low voltage; and
a carry part configured to output the high voltage of the clock signal as an n-th carry signal in response to the high voltage of the control node.

13. The display apparatus of claim 12, wherein a pixel transistor of the display area and a transistor of the gate drive circuit comprise an oxide semiconductive layer.

14. The display apparatus of claim 13, wherein the control pull-down part includes a first control pull-down part configured to pull-down the voltage of the control node into a first low voltage in response to an (n+1)-th carry signal outputted from an (n+1)-th stage, and receive the positive back-bias voltage,
the first control pull-down part includes a four-terminal transistor that includes a first control electrode configured to receive the (n+1)-th carry signal, a second control electrode configured to receive the positive back-bias voltage, an input electrode configured to receive the voltage of the control node, and an output electrode configured to receive the first low voltage.

15. The display apparatus of claim 14, wherein the control pull-down part includes a second control pull-down part configured to pull-down the voltage of the control node into a second low voltage that is lower than the first low voltage in response to an (n+2)-th carry signal outputted from an (n+2)-th stage, and receive the positive back-bias voltage,
the second control pull-down part includes a four-terminal transistor that includes a first control electrode configured to receive the (n+2)-th carry signal, a second control electrode configured to receive the positive back-bias voltage, an input electrode configured to receive the voltage of the control node, and an output electrode configured to receive the second low voltage.

16. The display apparatus of claim 14, wherein the n-th stage further comprises:
an invertor configured to output an output signal synchronized with the clock signal during the remaining period of a frame period except for a period during which the n-th carry signal has the high voltage.

17. The display apparatus of claim 16, wherein the n-th stage further comprises:
a control holding part configured to maintain the voltage of the control node to a second low voltage in response to the output signal outputted from the invertor.

18. The display apparatus of claim 17, wherein the control holding part comprises a four-terminal transistor, and
the four-terminal transistor includes a first control electrode configured to receive the output signal of the invertor, a second control electrode configured to receive the positive back-bias voltage, an input electrode configured to receive the voltage of the control node, and an output electrode configured to receive the second low voltage.

19. The display apparatus of claim 16, wherein the n-th stage further comprises:
a carry holding part configured to maintain the n-th carry signal to the second low voltage in response to the output signal outputted from the invertor.

20. The gate drive circuit of claim 16, wherein the n-th stage further comprises:
an output holding part configured to maintain the n-th gate signal to the first low
voltage in response to the output signal outputted from the invertor.

* * * * *